(12) United States Patent
Cui et al.

(10) Patent No.: US 9,235,508 B2
(45) Date of Patent: Jan. 12, 2016

(54) BUFFER MANAGEMENT STRATEGIES FOR FLASH-BASED STORAGE SYSTEMS

(71) Applicant: Peking University, Beijing (CN)

(72) Inventors: Bin Cui, Beijing (CN); Yanfei Lv, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 14/803,074

(22) Filed: Jul. 19, 2015

(65) Prior Publication Data
US 2015/0324296 A1 Nov. 12, 2015

Related U.S. Application Data

(62) Division of application No. 13/290,146, filed on Nov. 7, 2011, now Pat. No. 9,122,631.

(51) Int. Cl.
| | |
|---|---|
| G06F 12/14 | (2006.01) |
| G06F 12/02 | (2006.01) |
| G06F 12/12 | (2006.01) |
| G11C 16/10 | (2006.01) |

(52) U.S. Cl.
CPC .......... *G06F 12/0246* (2013.01); *G06F 12/121* (2013.01); *G11C 16/102* (2013.01)

(58) Field of Classification Search
CPC .. G06F 12/0246; G06F 12/121; G11C 16/102
USPC ......................................................... 711/103
See application file for complete search history.

(56) References Cited

U.S. PATENT DOCUMENTS

| | | | | |
|---|---|---|---|---|
| 5,586,270 | A | * 12/1996 | Rotier ................. | G06F 13/4068 710/13 |
| 7,761,655 | B2 | 7/2010 | Mizushima et al. | |
| 2004/0015731 | A1* | 1/2004 | Chu ...................... | G06F 1/3225 713/300 |
| 2005/0166086 | A1* | 7/2005 | Watanabe ........... | G06F 11/1666 714/6.2 |
| 2006/0181953 | A1 | 8/2006 | Rotenberg et al. | |
| 2013/0117497 | A1 | 5/2013 | Cui et al. | |

OTHER PUBLICATIONS

Heeseung Jo et al., "FAB: Flash-Aware Buffer Management Policy for Portable Media Players," IEEE Transactions on Consumer Electronics, Jul. 2006, pp. 485-493, vol. 52, No. 2.

(Continued)

*Primary Examiner* — Jae Yu
(74) *Attorney, Agent, or Firm* — Ren-Sheng International (57) ABSTRACT

Techniques are generally described related to a flash-based buffer management strategy. One example method to manage a buffer for a computer system may include maintaining a page-action list for monitoring a plurality of operations being executed on the computer system and utilizing a plurality of buffer pages of the buffer. An example page-action list may contain a hot-access queue for recently accessed buffer pages and a cold-access queue for less accessed buffer pages. The example method may also include, upon a determination that the buffer is full, identifying a victim buffer page from the plurality of buffer pages for eviction and evicting the victim buffer page from the buffer. The victim buffer page may be selected from the cold-access queue and based on a page weight, which is calculated based on a page state of the specific buffer page and a page hotness prediction for the specific buffer page might be accessed by an incoming operation.

20 Claims, 6 Drawing Sheets

(56) References Cited

OTHER PUBLICATIONS

Hyojun Kim et al., "BPLRU: A Buffer Management Scheme for Improving Random Writes in Flash Storage," in M. Baker and E. Riedel, 2008, pp. 239-252, FAST, USENIX.

Seon-Yeong Park et al., "CFLRU: A Replacement Algorithm for Flash Memory," in CASES, 2006, pp. 234-241.

Hoyoung Jung et al., "LRU-WSR: Intergration of LRU and Writes Sequence Reordering for Flash Memory," IEEE Transactions on Consumer Electronics, Aug. 2008, pp. 1215-1223, vol. 54, No. 3.

Hoyoung Jung et al., "LIRS-WSR: Integration of LIRS and Writes Sequence Reordering for Flash Memory," in ICCSA, 2007, pp. 224-237, LNCS 4705, Part 1.

Zhi Li et al., "CCF-LRU: A New Buffer Replacement Algorithm for Flash Memory," IEEE Transactions on Consumer Electronics, 2009, pp. 1351-1359, vol. 55, No. 3.

Yi Ou et al., "CFDC—A Flash-aware Replacement Policy for Database Buffer Management," in DaMoN, 2009, pp. 15-20.

Yi Ou et al., "Clean First or Dirty First? A Cost-Aware Self-Adaptive Buffer Replacement Policy," in IDEAS, 2010, pp. 7-14.

Sai Tung On et al., "FD-Buffer: A Buffer Manager for Databases on Flash Disks," in ACM, Oct. 2010, CIKM'10, Toronto, Ontario, Canada.

* cited by examiner

(500) A computer program product (502) Signal bearing medium (504) at least one of one or more instructions for monitoring, by a buffer management module, a plurality of operations being executed on the computer system and utilizing a plurality of buffer pages of the buffer;

upon a determination that the buffer is full, identifying a specific buffer page from the plurality of buffer pages for eviction, wherein the specific buffer page is selected based on a page state of the specific buffer page and a page hotness prediction for the specific buffer page; and evicting the specific buffer page from the buffer.

| (506) A computer readable medium | (508) A recordable medium | (510) A communications medium |

BUFFER MANAGEMENT STRATEGIES FOR FLASH-BASED STORAGE SYSTEMS

CROSS-REFERENCE TO RELATED APPLICATIONS

This application is a Division under 35 U.S.C. §121 of U.S. patent application Ser. No. 13/290,146, filed Nov. 7, 2011, now U.S. Pat. No. 9,122,631. The aforementioned U.S. patent application, including any appendices or attachments thereof, is hereby incorporated by reference in its entirety.

BACKGROUND

Buffer management is a core component of a computer system and its operating system. A buffer management scheme may adopt a specific buffer replacement policy to improve the performance of the computer system or an application (e.g., a file system or a database system). For a computer using conventional disk-based storage system, many buffer replacement policies mainly aim at reducing the rate of buffer misses which may cause excessive accesses to the disks. To minimize the miss rate, the conventional buffer replacement policies may place equal emphasis on both the read and write operations, and may not distinguish the impacts to the buffer memory from these read and writes operations.

Comparing to the conventional disk-based storage systems, flash disks may have a read-write asymmetry, which means a write operation on a flash disk may be an order of magnitude slower than a read operation on the flash disk. The conventional buffer replacement policies may give higher priority to dirty pages, and are mostly based on the current page state of the buffer pages. However, these conventional buffer replacement policies that are designed for disk-based storage systems may no longer be optimized for flash-based storage systems.

SUMMARY

In accordance with some embodiments of the present disclosure, a method to manage a buffer for a computer system is disclosed. The method includes maintaining a page-action list for monitoring a plurality of operations being executed on the computer system and utilizing a plurality of buffer pages of the buffer. The page-action list may contain a hot-access queue for recently accessed buffer pages and a cold-access queue for less accessed buffer pages. The method further includes, upon a determination that the buffer is full, identifying a victim buffer page from the plurality of buffer pages for eviction, wherein the victim buffer page is selected from the cold-access queue and based on a page weight, which is calculated based on a page state of the specific buffer page and a page hotness prediction for the specific buffer page might be accessed by an incoming operation. The method also includes evicting the victim buffer page from the buffer.

In accordance with some embodiments of the present disclosure, a system to manage a buffer for a computer system is disclosed. The system includes a page-action list and a buffer management module. The page-action list may contain a hot-access queue for recently accessed buffer pages and a cold-access queue for less accessed buffer pages. The buffer management module may be coupled with the page-action list. In addition, the buffer management module may be configured to monitor a plurality of operations being executed on the computer system and utilizing a plurality of buffer pages of the buffer, upon a determination that the buffer is full, identify a victim buffer page from the plurality of buffer pages for eviction, wherein the victim buffer page is selected from the cold-access queue and based on a page weight, which is calculated based on a page state of the specific buffer page and a page hotness prediction for the specific buffer page might be accessed by an incoming operation, and evict the victim buffer page from the buffer.

In accordance with some embodiments of the present disclosure, a machine-readable medium having a set of instructions which, when executed by a processor, cause the processor to perform a method to manage a buffer for a computer system is disclosed. The method may include maintaining a page-action list for monitoring a plurality of operations being executed on the computer system and utilizing a plurality of buffer pages of the buffer. The page-action list may contain a hot-access queue for recently accessed buffer pages and a cold-access queue for less accessed buffer pages. The method may also include upon a determination that the buffer is full, identifying a victim buffer page from the plurality of buffer pages for eviction and evicting the victim buffer page from the buffer. The victim buffer page may be selected from the cold-access queue and based on a page weight, which is calculated based on a page state of the specific buffer page and a page hotness prediction for the specific buffer page might be accessed by an incoming operation.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

This disclosure is drawn, inter alia, to methods, apparatuses, computer programs, and systems related to flash-based operation-aware buffer replacement strategies. When trying to evict a buffer page from a buffer associated with a flash-based storage system, one buffer replacement strategy is to consider all buffer pages' page states and the future operations that may rely on the buffer pages. The buffer replacement strategy may consider the asymmetry of read and write speeds on the flash-based storage system, as well as whether the buffer pages are clean or dirty. To further enhance the performance of the buffer, a second buffer replacement strategy may use binary-represented weights to approximate the combination of operation type and page state to reduce the time complexity of the buffer replacement strategy.

Figure 1:
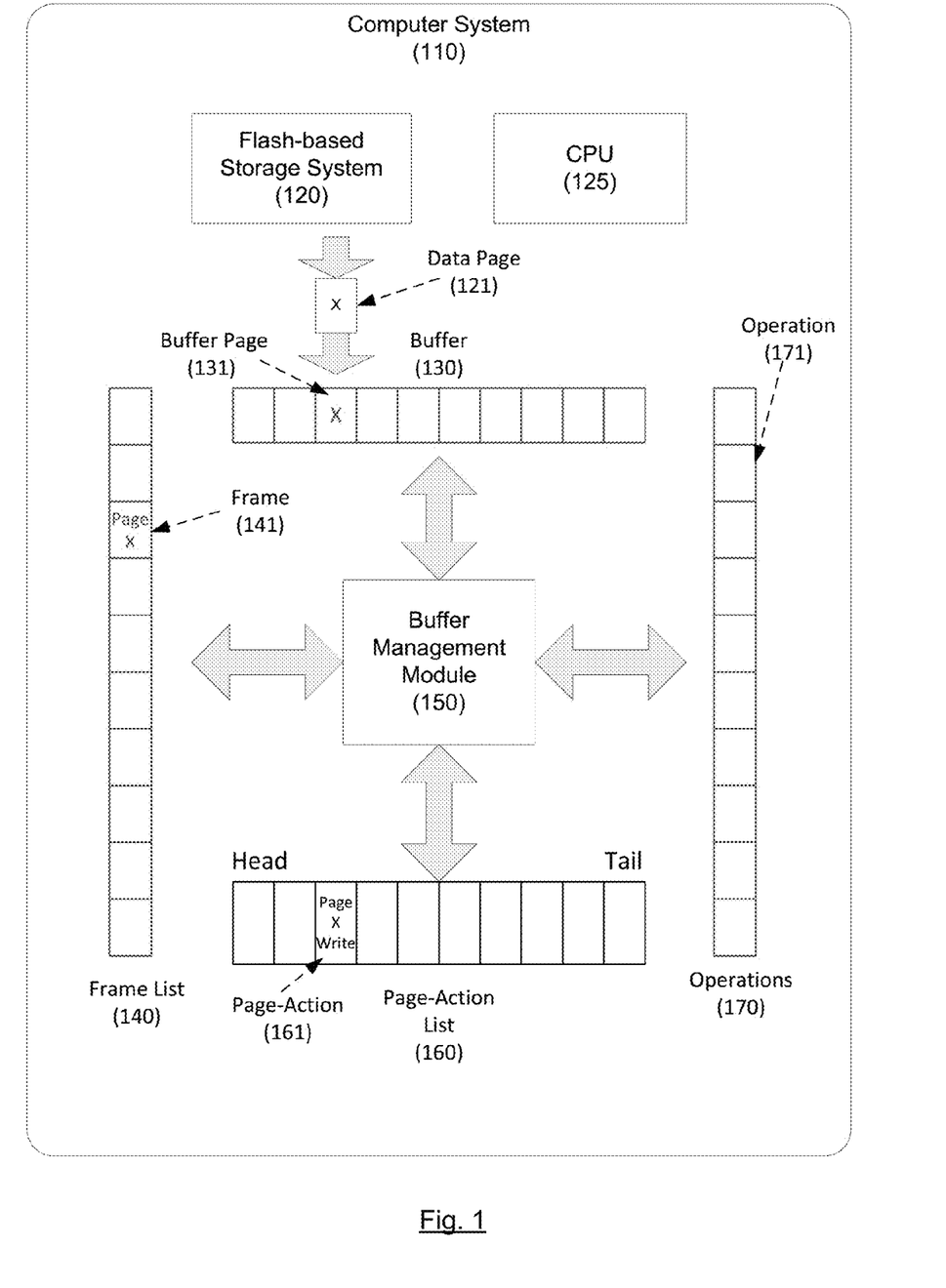
FIG. 1 shows a block diagram of an operational environment, in which illustrative embodiments of a buffer management module for a computer system are presented.

FIG. 1 shows a block diagram of an operational environment, in which illustrative embodiments of a buffer management module for a computer system are presented. In FIG. 1, a computer system 110 may contain a flash-based storage system 120 and a central processing unit (CPU) 125. The flash-based storage system 120 may be a non-volatile storage system used by the computer system 110 as system memory or as physical storage. The flash-based storage system 120 may provide byte-level or word-level access for read operations, while the write or erase operations may be performed at block-level or page-level. Thus, the flash-based storage system 120 may have a read-write asymmetry, since rewriting in blocks or pages often takes longer than reading in bytes or words. The CPU 125 may be processor(s) that control the overall operation of the computer system 110.

In some embodiments, the computer system 110 may have a buffer management module 150 to enhance the performance of the flash-based storage system 120. The buffer management module 150 may control a buffer (cache) 130, which may be a high-performance physical memory storage used to temporarily hold data read from, or to be written to, the flash-based storage system 120. The buffer 130 may contain a set of storage pages, each of which may have a size that is the same as, or different from, the size of a data page 121 stored or to be stored in the flash-based storage system 120. For convenience purpose, a data page that is cached in the buffer 130 may be referred to as a "buffer page", or a "buffered page."

In some embodiments, the buffer management module 150 may provide read buffering services for the flash-based storage system 120. Upon receiving a read request for a data page X 121 stored in the flash-based storage system 120, the buffer management module 150 may first check to see whether the data page 121 is available in the buffer 130, e.g., finding a corresponding buffer page in the buffer 130. If such a buffer page is not found in the buffer 130, a situation commonly referred to as a buffer miss or a cache miss, the buffer management module 150 may load the data page 121 from the flash-based storage system 120. The data page 121 may then be served as a response to the read request after it is saved in the buffer 130 as a buffer page 131. When the same data page is requested again, as long as the corresponding data page is not updated in the flash-based storage system 120, the buffered copy of the data page (e.g., the buffer page 131) may be immediately located (buffer hit), and retrieved for services. Since in a buffer hit situation, the data page 121 is not required to be retrieved from the flash-based storage system 120, the buffer management module 150 significantly increases the performance and availability of the flash-based storage system 120 in providing data services.

In some embodiments, the buffer management module 150 may provide write buffering service. In a write-through buffering/caching scheme, upon receiving a write request to store a page of data to the flash-based storage system 120, the buffer management module 150 may store the page as the buffer page 131 and synchronously store the same page of data to the flash-based storage system 120. Synchronous operation ensures that the data is cached in the buffer management module 150 and committed to the flash-based storage system 120 in a single transaction. When subsequent read requests are received by the buffer management module 150 for the same page of data, the buffer page 131 can be retrieved directly from the buffer 130 without having to accessing the flash-based storage system 120.

In some embodiments, the buffer management module 150 may implement a write-back buffering/caching scheme. In a write-back buffering/caching scheme, the page of data to be stored in the flash-based storage system 120 may first be saved as the buffer page 131 before being persistently stored (committed) to the flash-based storage system 120. Periodically, the uncommitted data, which is data that is buffered but yet stored to the flash-based storage system 120, are asynchronously transmitted in batches to the flash-based storage system 120 for persistent storage. When a buffer page contains the same data as the associated data page in the flash-based storage system 120, the buffer page may be referred to as a "clean" page. If the buffer page is subsequently updated, but before the updated data is synchronized to the flash-based storage system 120, the buffer page may be referred to as a "dirty" page.

In some embodiments, the buffered data stored in the buffer 130 can be swapped out of (or evicted from) the buffer 130 if it is not frequently requested. Evicting a seldom accessed data removes such data from the buffer 130 to create space for the buffering of newly requested data. For example, if there is no space left in the buffer 130, and newly requested data is not in the buffer 130, then the less requested data may be evicted from, or swapped out of, the buffer 130 to create space for the newly requested data. The buffer pages evicted or to be evicted may be referred to as the "victim" pages.

In some embodiments, the buffer management module 150 may be configured to buffer data pages, data blocks, files, directories, and/or other logical or physical storage entities stored in the flash-based storage system 120. During buffering of a data page 121, the data associated with the data page 121 may be retrieved from the flash-based storage system 120 and stored as the buffer page 131 in the buffer 130. In addition, the ID and/or the address of the data page 121 in the flash-based storage system 120 may also be recorded in the buffer page 131 for identification and association purposes. For example, a buffer page may have an ID "X" which may be associated with an ID and/or an address that can be used to identify and retrieve the page of data from the flash-based storage system 120.

In some embodiments, the buffer management module 150 may maintain a frame list 140 to track the status of the buffer pages in the buffer 130. The frame list 140 may contain a set of frames 141, each of which is associated with and is used to track a corresponding buffer page 131. For example, the frame 141 may indicate whether the buffer page 131 is used or empty. The frame 141 may also contain status information, such as whether the associated buffer page is clean or dirty, as well as other information that allows the buffer management module 150 to determine buffer replacement policies. Therefore, the frame 141 may be deemed, or may contain, a reference to a specific buffer page 131.

In some embodiments, the various tasks executing or to be executed on the computer system 110 may be defined as a set of operations 170. Each operation 171 in the set of operations 170 may utilize the flash-based storage system 120 for data storing and/or retrieving. Thus, the buffer management module 150 may enhance the performance of the computer system 110 by providing a fast buffer replacement strategy during buffering of the data pages. Specifically, the buffer management module 150 may maintain a page-action list 160 to track the execution of the set of operations 170 by the CPU 125. The buffer management module 150 may be a hardware module or a software component (e.g., as a part of an operating system supporting the computer system 110) that is configured with embodiments of the buffer management strategies as described below.

During processing, an operation 171 may request to access one or more data pages stored in the flash-based storage system 120, and the buffer management module 150 may record the buffer action (e.g., read or write) the operation 171 intended to perform, the state of the buffer pages (e.g., clean or dirty) after the operation is processed, and/or the IDs of the specific data pages that have been requested by the operation 171, in the page-action list 160. In FIG. 1's example, for the operation 171 being executed by the CPU 125 and accessing a data page "X", the buffer management module 150 may load the data page X as the buffer page 131, and create a page-action 161 to store the operation's buffer action ("Write"), the current page state of the buffer page ("Dirty"), as well as the ID of the requested data page ("X").

In some embodiments, after being created, the page-action 161 may then be stored in the page-action list 160. In other words, multiple page-actions in the page-action list 160 may be referring to a single buffer page 131, but each of these page-actions may represent a distinctive buffer action (buffer-page-read or buffer-page-write) occurred when a specific operation 171 is executed on the computer system 110. All the page-actions in the page-action list 160 may be hashed for quick access, and used for determining how and when to evict any buffer pages from the buffer 130. In other words, the page-action list 160 records detail information about how the operations 170 utilized the buffer 130. By reviewing the page-action list 160, the buffer management module 150 may be able to analyze the buffer actions, types and orders, the buffer pages that have been utilized, as well as how the buffer pages are requested.

In some embodiments, the buffer management module 150 may also update the frame list 140 based on a specific operation 171. For example, when a specific buffer page is accessed/used, the buffer management module 150 may record, in a corresponding frame 141, the state of the buffer page that is stored in the buffer page (clean or dirty), as well as the ID (e.g., "X") of the buffered data page. Additional information that may be stored in the frame 141 is further described below.

Figure 2:
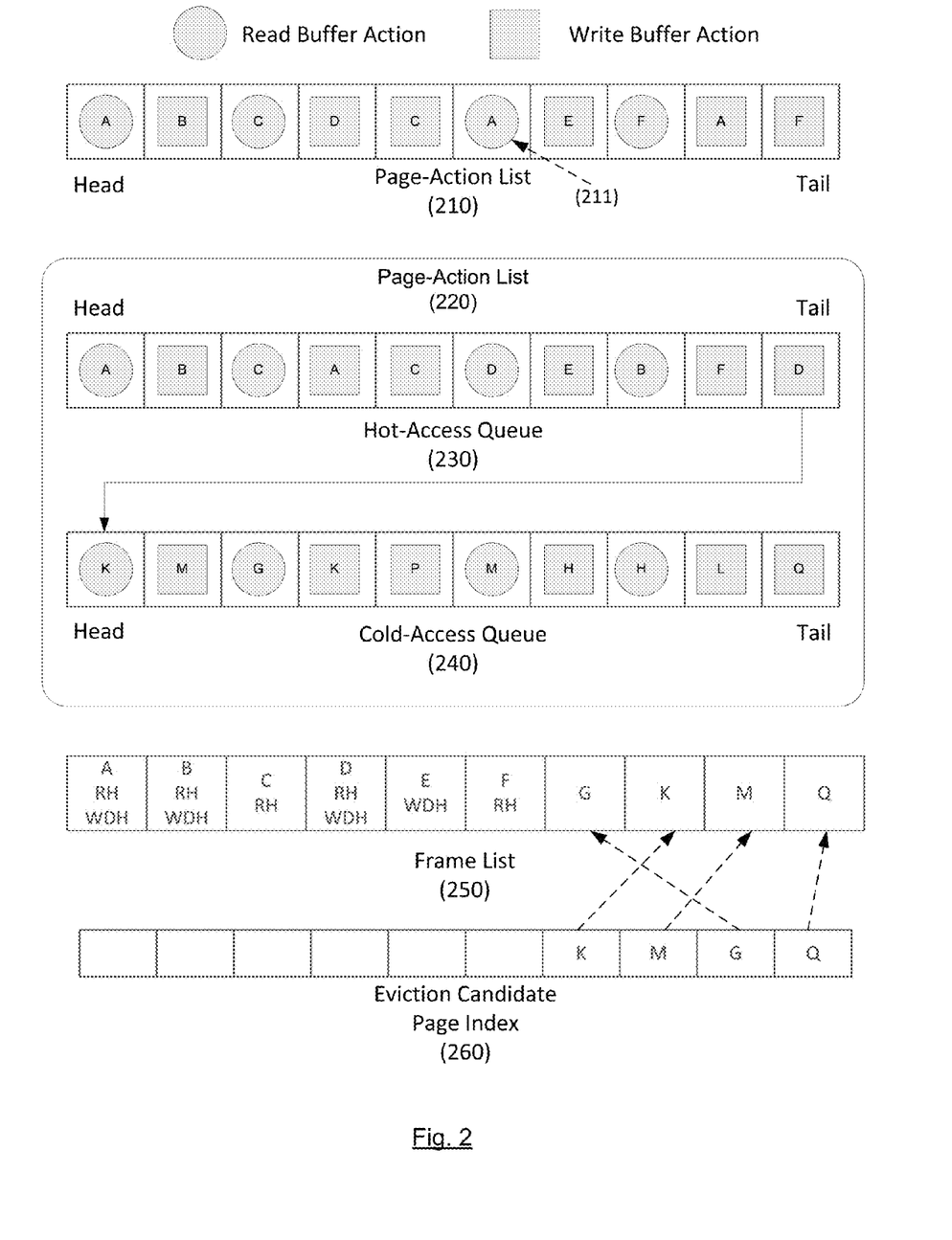
FIG. 2 shows illustrative embodiments of various buffer management strategies for flash-based storage system.

FIG. 2 shows illustrative embodiments of various buffer management strategies for flash-based storage system. In FIG. 2, a page-action list 210, which is similar to the page-action list 160 of FIG. 1, may be configured to record, chronologically from left to right, a set of operations that have been processed, or scheduled to be processed, by a computer system. A page-action for a "read buffer action" by an operation may be indicated by a "circle", and a page-action for a "write buffer action" by an operation may be shown by a "square". The character within each page-action may refer to the ID of a specific data page that is buffered in a buffer. In other words, the page-action list 210 may contain a set of page-actions to store various operations' corresponding data request actions, buffer pages' states, and/or IDs of the data pages.

In a conventional disk-based storage system, a data read and a data write operation may have similar costs in terms of processing time and system resource. Thus, the primary goal of managing a buffer for the disk-based systems is to maximize the hit rate of the buffer, while ignoring the types of action performed by the operations. In comparison, the read/write characteristics of a flash-based storage system are different from those of the disk-based storage system. In some embodiments, a buffer management strategy for a flash-based storage system may consider the cost difference between the read and write operations, and try to keep more dirty pages in the buffer to reduce the expensive cost of synchronizing to the flash-based storage system. However, keeping inactive dirty pages in buffer may not always be beneficial, as the inactive dirty pages take up the precious and limited buffer spaces.

In some embodiments, the effect of future operations that are scheduled to be executed in the computer system may hold the key to enhance the performance of the buffer management strategies. In other words, the I/O time reduced by the buffering of a specific page may be related to both the current state of the buffer page and the future operations on the data page that is stored in the buffer page.

In the following Table 1, Cr refers to the time needed for reading a data page from the flash-based storage system into the buffer. And Cw stands for the time needed for writing a data page from the buffer to the flash-based storage system. There are four cases according to the combinations of operations and page states, as the following:

TABLE 1

| Future Operation's Buffer Action | When a buffer page is clean | When a buffer page is dirty |
|---|---|---|
| Read | Cr | Cr |
| Write | Cr | Cr + Cw |

Table 1 shows that when the current state of the buffer page is clean and the next operation on the data page has a read buffer action, the buffer page can be used directly without accessing the flash-based storage system. Thus, the I/O time Cr for loading the data page into the buffer is saved. Similarly, when the current state of the buffer page is dirty and the next operation on the data page has a read buffer action, since the dirty buffer page in the buffer reflects the most up-to-date version of the data, the read buffer action can directly read the dirty buffer page, and the time for a buffer read Cr may also be saved. The I/O time of dirty page write back is not considered in this case because the write back will eventually happen later.

Table 1 further shows that when the current state of the buffer page is clean and the next operation on the data page has a write buffer action, then the buffer page may turn dirty. Still, the time benefit for using buffer in this case is also Cr, since no data loading is necessary. Further, when the current state of the buffer page is dirty and the next operation on the data page has a write buffer action, the next write operation can be merged with the previous ones since the buffer page has not been synchronized with the flash-based storage system, and hence a synchronization write cost Cw is saved. At a later time, a page write to the flash memory may be performed when the buffer page is evicted. Since no read is necessary, the time benefit for using buffer in this case may be Cr+Cw.

In some embodiments, an operation-aware buffer management strategy may be configured to examine how a sequence of operations utilizes the data pages to estimate/predict the hotness of these data pages. There are various metrics (e.g., frequency, recency) to indicate the hotness of a data page. For example, an inter-operation distance (IOD) metric may reflect the frequency of a specific buffer action utilizing a specific data page ("action-on-page") by counting the distance (e.g., the number of various different buffer actions performed on other data pages) in between two consecutive occurrences of the specific action-on-page, including the current specific action-on-page. If a specific action-on-page does not appear again in the succeeding operation sequence, the IOD value for the specific action-on-page may not change. Therefore, an operation recency (OR) metric may be used to reflect recency of the specific action-on-page by finding the number of distinct buffer actions performed on other buffer pages, counting the specific action-on-page. The IOD and OR may be two complementary metrics to measure the hotness of a data page. In other words, the IOD may show a long-term workload pattern. And the OR may indicate the freshness of a page access.

In FIG. 2, the page-action list 210 may illustrate a sequence of operations that have been processed by a computer system and recorded by a buffer management module. The page-action list 210 stores some of the latest read and write buffer actions performed on various buffer pages. The page IDs for these buffer pages are stored in the page-action list 210 in the same order as these buffer pages are accessed by the sequence of operations, regardless of whether these buffer pages are evicted from the buffer. The set of page-actions in the page-action list 210 may be ordered in a least-recent-used (LRU) fashion. Thus, when a new buffer action is performed on a specific data page, a new page-action may be generated for the new action-on-page, and stored in the head (MRU, most-recent-used) of the page-action list 210. Further, one or more existing page-actions in the page-action list 210 may be removed when they are no longer needed.

In particular, assuming a specific page-action in the page-action list 210 indicates a "read" operation on a data page "X", the number of different page-actions between the head of the page-action list 210 and the specific page-action may used to calculate the current value OR for the "read-on-X." Likely, assuming the specific page-action is for a "write" buffer action on a data page "Y", when another "write" buffer action is performed on data page Y, the current OR value for the "write-on-Y" may be used to determine the IOD value for the "write-on-Y". Meanwhile, the OR value for the "write-on-Y" may be changing (incrementing) when additional buffer actions are performed on other data pages. Therefore, for every operation performed, the IOD value for the specific action-on-page may be immediately calculated and stored in the frame that is associated with the specific buffer page. In comparison, the OR value for the specific action-on-page may be calculated whenever the OR value is needed. Further, the frame associated with the buffer page may be used to store the OR value for read, the OR value for write, the IOD value for read, and the IOD value for write, all of which are associated with the buffer page, as well as the state of the buffer page. To accelerate page and information access, the page-actions in the page-action list 210 may be indexed by an in-memory hash table according to data page ID.

In FIG. 2's exemplary page-action list 210, after a new page-action "read-on-page A" is added to the head of page-action list 210, the IOD value for the read-on-A may be calculated. In this case, the IOD value for read-on-A is (4+1)=5, as there are four distinctive action-on-pages (a write-on-B, a read-on-C, a write-on-D, and a write-on-C) between the two occurrences of read-on-A, plus the last read-on-A. The OR value for read-on-C at this moment is 3, as there are two distinct page-actions (a read-on-A and a write-on-B) performed along with the last occurrence of read-on-B. After the IOD value is calculated, any older read-on-A (e.g., page-action 211) may be removed from the page-action list 210.

Therefore, there may be no duplicated page-action in the page-action list 210. And the IOD and OR values for a specific action-on-page are calculated based on the distinctive (unique) page-actions in the page-action list 210.

In some embodiments, an operation hotness prediction value H, which integrates IOD and OR, may be used to reflect the hotness of a specific action-on-page. The hotness value H may be calculated using the following formula 1:

$$H=a*IOD+(1-a)*OR \qquad \text{(Formula 1)}$$

where a is a tuning parameter to determine the importance of two factors. In some embodiments, a may be set to be 0.5 to give the IOD and OR an equal weight. If IOD value does not exist for some pages, the OR value may be used as the IOD value in the above formula. Thus, the hotness value H may indicate the popularity of a specific operation on a data page according to the operation statistics. In other words, the hotness value H may be deemed a hotness prediction for an operation that might use the data page. As shown in formula 1, the higher the IOD and the OR values, the higher the calculated hotness value H. In some embodiments, since high IOD and OR values indicate the data page is being less used, a high hotness value H may indicate that a buffer page may be a candidate for eviction. Thus, a buffer page with small H value should be remained in the buffer as it has higher probability to be accessed subsequently.

In some embodiments, when a new operation is processed, the buffer management module may first perform buffer allocation for the new operation, and then record the necessary information to the frame list and the page-action list. For example, the buffer management module may store the IDs of the data pages, the buffer page(s) the new operation accessed, and the buffer actions the new operation performed on the buffer page(s) to the page-action list 210. Further, the buffer management module may update the page-action list 210 by adding a new page-action related to the new operation, and remove the relevant old page-actions. In some embodiments, the buffer management module may maintain at most two page-actions in the page-action list to record the two occurrences of a specific action-on-page. Since the IOD and the OR values for any data page may be calculated using these two page-actions, any page-actions that store information that is older than these two page-actions may be unnecessary, and may be removed from the page-action list without affecting the above calculation of the hotness values. Further, after the IOD value is calculated, the older one of the two page-actions may also be removed.

In some embodiments, a page weight, which is calculated based on the hotness of a data page in view of the future operations, may be utilized for determining which buffer page(s) should be evicted from the buffer. In the following formula 2, supposing r and w are the latest read and write operations on a data page p, the page weight Wp may be defined as:

$$Wp=Cr/Hr+Cr/Hw; \text{ when } p \text{ is clean}$$

$$Wp=Cr/Hr+(Cr+Cw)/Hw; \text{ when } p \text{ is dirty} \qquad \text{(Formula 2)}$$

where Hr and Hw refer to the page-read hotness prediction value for a read-on-p, and the page-write hotness prediction value for a write-on-p, respectively. And if there is no previous read or write buffer actions on page p, the corresponding Wp values in the above formula should be zero. Thus, the Hr and the Hw values may be viewed as statistical information that, although derived from some of the past operations, can be used as a probability prediction for the future operations.

In the above formula, when a buffer page p is clean, the probability for a future read buffer action may be indicated by the hotness value Hr. And the probability for a future write buffer action may be shown by the hotness value Hw. As described before, a read buffer action on a clean page may have a time save of Cr, and a write buffer action on a clean page may have a time save of Cw. Thus, the Hr and Hw values may be weighted according to the corresponding buffer time saves. Similarly, when the buffer page p is dirty, the Hr and Hw values may also be weighted by their corresponding time saves (Cr and Cr+Cw). Thus, the weight value Wp takes the I/O time reduced by buffering, as well as the hotness prediction of the read and write operations on the page p, into consideration.

In some embodiments, a flash-based, operation-aware buffer replacement algorithm (FOR) may use the above formulas to calculate a corresponding weight for each of the buffer pages in the buffer, and choose the buffer page(s) that have low or the lowest weights for eviction. Since a low weight value may be attributed to high hotness values Hr and/or Hw, and high hotness values mean the page may have not been accessed recently and/or frequently by a read operation and/or a write operation, evicting buffer pages with low weight value could bring efficiency to the data buffering.

In some embodiments, when buffering of a new data page is needed and there is no empty space left in the buffer, the FOR algorithm may select one or more buffer pages from the buffer for eviction. The FOR algorithm may first calculate the OR and IOD values for each buffer page in the buffer, and generate a corresponding weight value for the buffer page. In some embodiments, the buffer page(s) that have a low weight value may be selected as the victim(s) for eviction. After eviction, the space previously occupied by the evicted page may be used for buffering of the new data page. Each time an eviction is required, the above process may be repeated, and the weights for all the buffer pages may have to be re-calculated. Therefore, the above process has a complexity of O(n), which may not be ideal for a database system which is sensitive to the performance of the buffering strategy.

In some embodiments, an approximated FOR algorithm (FOR+), which has an O(1) time complexity, may be adopted for determining the victim pages for eviction. Instead of calculating weights values for each buffer page, the FOR+ algorithm categorizes these buffer pages into two weight states (e.g., high and low). The buffer pages that belong to low weight state may be chosen as the victim pages for eviction. To accomplish this, additional factors may be considered along with the page state and the operation hotness.

In the above examples, when a buffer page's weight value is high, the buffer page may be under the following four situations: RCH (Read Clean High), WCH (Write Clean High), RDH (Read Dirty High), and WDH (Write Dirty High). Among these four situations, since buffering under RCH and RDH may lead to the same I/O time reduction Cr, the RCH and RDH may be combined to a new situation RH (Read page High). In comparison, once a buffer page is updated in buffer, the state of the buffer page changes to dirty. Thus, WCH is volatile, and the WDH mark is more relevant for a dirty page. As a result, the FOR+ algorithm may take two of the above four situations into separate consideration: RH and WDH. That is, for each buffer page, a RH weight state and a WDH weight state may be maintained in a data structure for the buffer page. When any one of these two weight states has a "high" value, the buffer page may not be a candidate for eviction.

To further simplify the process, rather than generating and comparing the weight values for all the buffer pages, the FOR+ algorithm may assign high or low weight state values to each of the buffer pages. That is, each buffer page may have a RH weight state and a WDH weight state. Each of the RH weight state and the WDH weight state can have a high value or a low value. The high or low value is assigned according to the buffer pages' IOD values, as the IOD values better reflect the access frequency. The high weight state values may be set to low (cleared) according to the value of OR. In this case, the low weight state values may indicate that buffer pages have not been accessed for a long time, and can be evicted. Further, if the Cr/IOD is relatively high in all the operations, the RH weight state for the buffer page may be set to high.

In some embodiments, the FOR+ algorithm may separate a page-action list 220 into two queues, a hot-access queue 230 and a cold-access queue 240. The hot-access queue 230 may store page-actions for buffer pages that are recently read or written. And the cold-access queue 240 may store page-actions for buffer pages that are relatively less accessed. The hot-access queue 230 and the cold-access queue 240 may be adjusted in a LRU manner. During operations, a page-action in the hot-access queue 230 may be moved to the cold-access queue 240 if the same action has not been performed on the associated buffer page for a while. The buffer pages in the cold-access queue 240 may be moved out of the cold-access queue 240 and back into the hot-access queue 230 if a same page-action has been recently performed. Victim pages for eviction may be selected from the cold-access queue 240. If a victim page is selected from the cold-access queue 240, and have "low" values for its RH and WDH weight states, then the victim page may be evicted accordingly.

In some embodiments, a frame list 250, similar to the frame list 140 of FIG. 1, may be used to record the status information for each of the buffer pages in the buffer. Each frame in the frame list 250 may track a corresponding buffer page's RH and WDH weight states. In FIG. 2's illustration, for each buffer page, the high RH or WDH weight states may be marked, and the low RH or WDH weight state may not be marked. For example, buffer page A may have a high RH weight state and a high WDH weight state, buffer page C may have a high RH weight state and a low WDH weight state, buffer page E may have a low RH weight state and a high WDH weight state, and the buffer page G may have a low RH weight state and a low WDH weight state, etc.

In some embodiments, once a new operation is performed, the FOR+ algorithm may first determine the new operation's action(s) and the buffer page(s) the new operation utilizes, and search in the page-action list 220 for any existing page-action that represents the action-on-page. If an existing page-action is found in the hot-access queue 230 or the cold-access queue 240, then the existing page-action may be removed from the hot-access queue 230 or the cold-access queue 240. Afterward, a new page-action may be created and placed at the head of the hot-access queue 230.

In some embodiments, when the new operation has a read buffer action, if an existing page-action is found in the hot-access queue 230, then the frame for the buffer page may set its RH weight state to "high." When no existing page-action is found in the page-action list 220, or an existing page-action is located in the cold-access queue 240, the above setting of the RH weight state is not performed. Thus, having a new read buffer action on a buffer page may put a corresponding page-action to the head of the hot-access queue 230, but not by itself set the RH weight state to "high" value. Afterward, as long as an existing page-action remain in the hot-access queue 230, a second read action on the same buffer page may cause the RH weight state to be set to the "high" value. In comparison, if a buffer page referenced in the hot-access queue 230 is not accessed again for a while, it may be moved from the hot-access queue 230 into the cold-access queue 240, and subsequently removed from the cold-access queue 240 for eviction. Further, when the new operation has a write buffer action, then the FOR+ algorithm may perform the above page-action operations, and set the WDH weight state to "high" in the frame that is associated with the buffer page. Such a configuration may allow buffer pages under the write buffer action to be less likely to be evicted than the buffer pages under the read buffer action.

In some embodiments, once the hot-access queue 230 is full, any addition of new page-action to the front of the hot-access queue 230 may result in having a page-action at the tail of the hot-access queue 230 being moved to the head of the cold-access queue 240. Afterward, the frame for the buffer page that has page-action moved to the cold-access queue 240 may set its RH weight state to "low" value, without changing its WDH weight state value. Once the cold-access queue 240 is full, then the adding of a page-action to the head of the cold-access queue 240 may result in the selecting of a page-action at or near the tail of the cold-access queue 240 for eviction. The removal of one or more page-actions from the cold-access queue 240 may also result in setting the WDH weight states to "low" values for the frame(s) that are associated with the page-action(s). In some embodiments, once a cold page-action is changed to hot, a hot page-action may need to be changed to cold, so that the number of cold page-actions is constant in the cold-access queue 240. Afterward, the buffer page(s) identified by the removed page-actions may be evicted from the buffer, since the buffer page(s) have "low" RH and WDH weight states.

In some embodiments, to quickly find all the frames in the frame list 250 that have low RH and WDH weight states, one or more indices may be deployed to enhancement the FOR+ algorithm's performance. For example, once a page-action is removed from the cold-access queue 240, a reference may be set in the eviction candidate page index 260 to referencing the corresponding frame in the frame list 250 that has "low" RH and WDH weight states. During eviction, the eviction candidate page index 260 may be used to locate the one or more referenced frames, resulting in the obtaining of the victim page(s). When a new page-action is added to the page-action list 220, the reference to the corresponding frame may be removed from the eviction candidate page index 260. In addition, other indices may be used for quick identifying the front and the end of the hot-access queue 230 and the cold-access queue 240.

Thus, the above process utilizes the page-action list 220 for quickly sorting the page-actions into hot-access and cold-access queues, without having to calculate individual buffer page's hotness values. Further, the above process may give more weight to the buffer page having write buffer action, since the frame that is associated with the write-on-page may have a "high" WDH value, which may be set to "low" after the page-action travels through the hot-access queue 230 and the cold-access queue 240, and being removed from the page-action list 220 for not being used again. In comparison, a buffer page having a read buffer action may have a "high" RH weight state when an identical page-action is located in the hot-access queue 230, and the RH weight state may be quickly set to "low" when the page-action is moved from the hot-access queue 230 to the cold-access queue 240. Therefore, the buffer pages that have read-on-page but no write-on-page may have a much higher chance of being evicted. By evaluating the RH and WDH weight states, no complicated calculation of the weight values is needed. The FOR+ algorithm may incur a limited amount of space overhead compared to the buffered data. Hence the FOR+ algorithm has a O(1) time complexity on average for every buffer page access.

Figure 3:
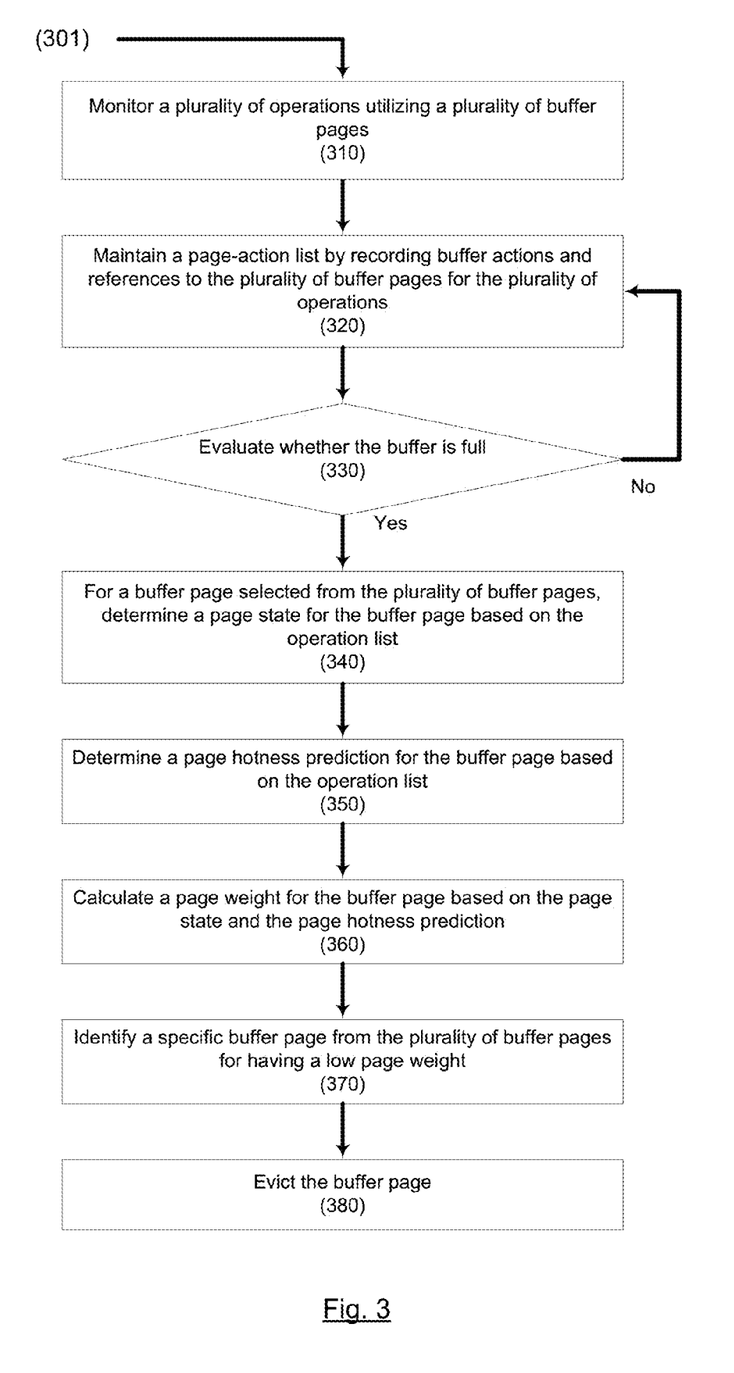
FIG. 3 shows a flow diagram of an illustrative embodiment of a process for implementing a flash-based buffer management strategy.

FIG. 3 shows a flow diagram of an illustrative embodiment of a process for implementing a flash-based buffer management strategy. The process 301 may include one or more operations, functions, or actions as illustrated by blocks 310, 320, 330, 340, 350, 360, 370, and/or 380, which may be performed by hardware, software and/or firmware. The various blocks are not intended to be limiting to the described embodiments. For example, one skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. Although the blocks are illustrated in a sequential order, these blocks may also be performed in parallel, and/or in a different order than those described herein. In some embodiments, machine-executable instructions for the process 301 may be stored in memory, executed by a processor, and/or implemented in the computer system 110 of FIG. 1.

At block 310, a buffer management module of a computer system may utilize a buffer during the processing of a plurality of operations. The buffer may be associated with a flash-based storage system, and may contain a plurality of buffer pages that are buffering/caching the pages of data for the flash-based storage system. For each of the plurality of operations, the buffer management module may monitor the buffer page(s) accessed by the operation, as well as the type of buffer action (read or write) that is performed by the operation on the buffer page(s).

At block 320, the buffer management module may maintain a page-action list for the monitoring of the plurality of operations. The page-action list may be used for storing one or more page-actions. Each page-action may record the buffer action of a specific operation (selected from the plurality of operations) and record/reference the buffer page(s) accessed by the specific operation. Further, additional information, such as whether the buffer page referenced by the page-action is clean or dirty, as well as timestamps, etc, may be stored in the page-action. Indices to the page-action list may be setup for fast search and retrieval of the page-actions based on buffer page's page ID.

At block 330, the computer system may try to process a specific operation selected from the plurality of operations. The specific operation may request for a data page (denoted page x) from the flash-based storage system. The buffer management module may utilize the buffer to enhancement the performance of the data request. If the requested page x is found in the buffer, the buffer management module may serve the founded buffer page x as a response to the data request by the specific operation. Further, the buffer management module may create a new page-action for the specific operation, and add the new page-action to the head of the page-action list. In some embodiments, adding of a new page-action to the page-action list may trigger the calculation of the IOD for the specific buffer page referenced by the new page-action.

In some embodiments, if the requested data page x is not in the buffer, the buffer management module may evaluate whether the buffer is full, meaning that all the buffer pages are used for buffering data. If the evaluation at block 330 returns "No", indicating the buffer is not full, the buffer management module may allocate a new buffer page from the buffer for the buffering of the page x. In the meantime, process 301 may proceed to block 320, in which the buffer management module may continue monitoring the plurality of operations. In this case, the buffer management module may create a new page-action for the specific operation, and add the new page-action to the head of the page-action list. Afterward, the computer system may finish processing the specific operation using the allocated new buffer page.

In some embodiments, if the evaluation at block 330 returns "Yes", meaning the buffer is full, then process 301 may proceed to block 340, and tries to identify one or more victim pages from the buffer for eviction. At block 340, for each buffer page in the plurality of buffer pages, the buffer management module may determine the page state for the buffer page. The page state may be retrieved from a frame that is selected from a frame list and is associated with the buffer page. For example, the frame may indicate a write buffer action has been applied to the buffer page. In this case, the state of the buffer page may be "dirty." When there is no write buffer action on the buffer page, the state of the buffer page may be "clean." Further, the buffer page's state may also be derived from the page-actions that are selected from the page-action list and are referencing the buffer page.

At block 350, the buffer management module may determine a page hotness prediction for the buffer page. The page hotness prediction may be calculated using the formula 1 shown above, based on the IOD and OR values derived from the page-action list. Specifically, the buffer management module may determine the IOD for the buffer page based on a number of operation occurrences after a specific buffer action on the first buffer page, and determine the OR for the buffer page based on a previous occurrence of the specific buffer action on the specific buffer page. The specific buffer action may be a read buffer action or a write buffer action.

At block 360, the buffer management module may calculate a page weight for the buffer page associated with the page-action, based on the page state determined at block 340, and the page hotness prediction determined at block 350. In some embodiments, the page weight may be calculated using the formula 2 shown above. Specifically, the buffer management module may first determine whether the page state is clean or dirty, and then use the respective portion of the formula in the above formula 2. The buffer management module may then calculate a page-read hotness prediction and/or a page-write hotness prediction, and calculate the page weight using the page-read hotness prediction and the page-write hotness prediction, with their corresponding buffering time saves.

At block 370, once each buffer page in the buffer has a calculated weight values, the buffer management module may identify a specific buffer page from the plurality of buffer pages for having a low page weight. In some embodiments, the buffer management module may choose the buffer page that has the lowest page weight. Alternatively, any buffer page that has a page weight that below a predetermined threshold weight value may be deemed a victim page for eviction.

At block 380, the buffer management module may evict from the buffer the one or more buffer pages identified at block 370, thereby creating empty space for buffering the new page x that is required by the specific operation to be executed on the computer system. Further, the buffer management module may make update to the page-action list by removing all page-actions that are associated with the evicted buffer pages, and create new page-action for the newly buffered page.

Figure 4:
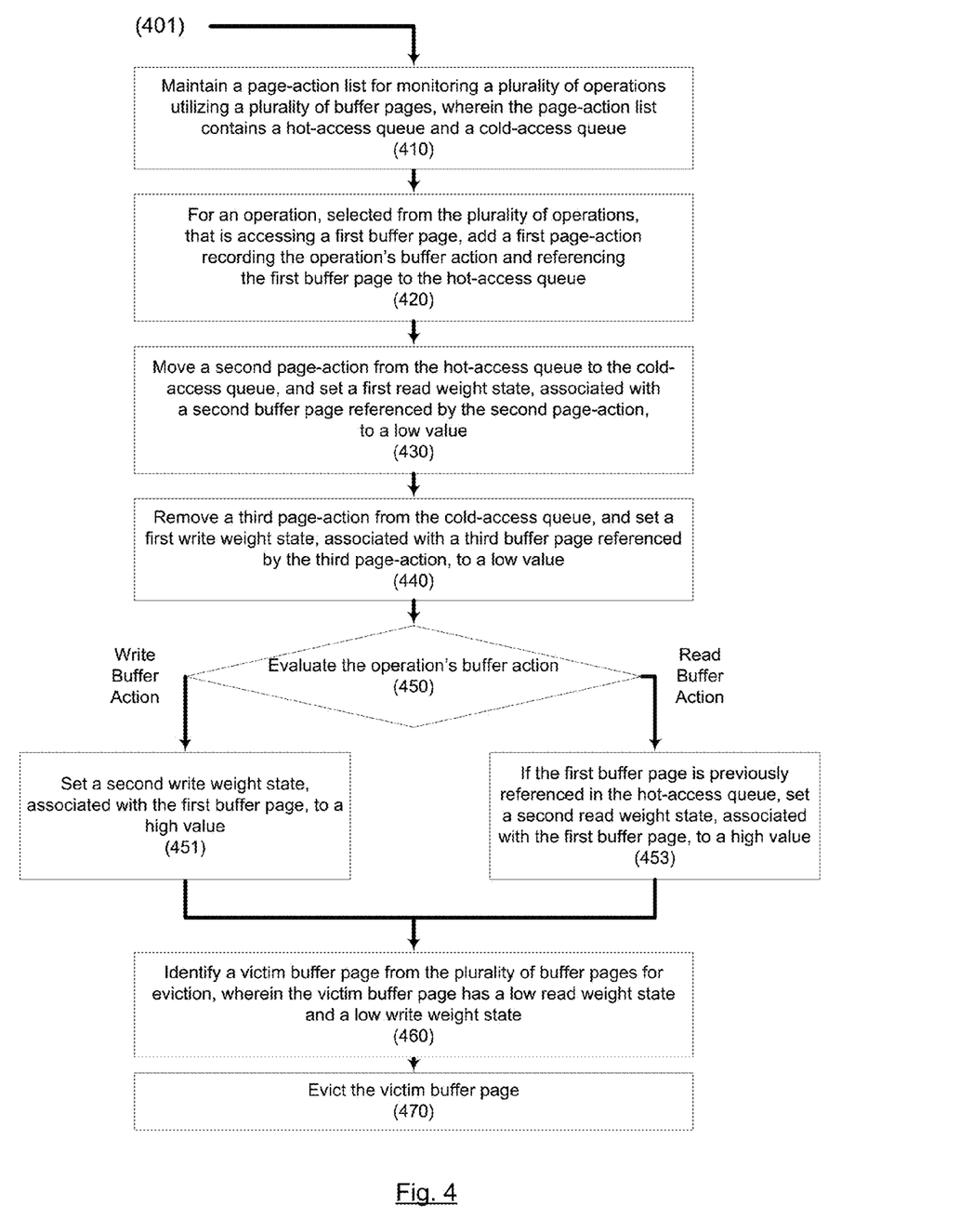
FIG. 4 shows a flow diagram of an illustrative embodiment of a process for implementing an enhanced flash-based buffer management strategy.

FIG. 4 shows a flow diagram of an illustrative embodiment of a process for implementing an enhanced flash-based buffer management strategy. The process 401 may include one or more operations, functions, or actions as illustrated by blocks 410, 420, 430, 440, 450, 451, 453, 460, and/or 470, which may be performed by hardware, software and/or firmware.

At block 410, a buffer management module may maintain a page-action list for monitoring a plurality of operations which may utilize a buffer when accessing a flash-based storage system. The buffer may contain a plurality of buffer pages for buffering/caching the pages of data retrieved from/saved to the flash-based storage system. In some embodiments, the page-action list may contain a hot-access queue and a cold-access queue. Further, a frame list, which contains a plurality of frames each of which is associated with a corresponding buffer page in the buffer. Each frame may have a read weight state ("RH") and a write weight state ("WDH") for identifying whether the associated buffer page has recently been accessed.

In some embodiments, the hot-access queue and the cold-access queue may provide a higher priority to a buffer page that is associated with a write action than a buffer page that is associated with a read action but not write action. The buffer page that is associated with a write action may have a "high" WDH state when the buffer page is referenced in the hot-access queue and/or the cold-access queue. The buffer page that is associated with a read action but not a write action may have a "high" RH state only when the buffer page is referenced in the hot-access queue while the buffer page is being read. Since a buffer page having "low" RH and WDH states may be evicted, by maintaining a "high" WDH state longer, the "dirty" buffer pages in the buffer may be kept longer.

At block 420, a computer system may process a specific operation, which may be selected from a plurality of operations. The operation may access a first buffer page selected from the plurality of buffer pages. In some embodiments, the buffer management module may evaluate the specific operation's buffer action, and create a new page-action ("first page-action") that references the first buffer page and records the specific operation's buffer action. The new page-action may be stored to the head of the hot-access queue in the page-action list. In some embodiments, the buffer management module may first check the hot-access queue and the cold-access queue, and remove any identical page-action (e.g., one that referencing the same buffer page and having the same buffer action) from the page-action list before adding the newly created page-action to the head of the hot-access queue. Further, the buffer management module may locate the frame ("first frame") from the frame list which is associated with the first buffer.

At block 430, if the hot-access queue is full, the buffer management module may select one or more page-actions from the tail of the hot-access queue, move them out of the hot-access queue, and into the head of the cold-access queue. Assuming a page-action ("second page-action") is selected from the tail of the hot-access queue and moved it to the head of the cold-access queue, the buffer management module may locate the frame ("second frame") from the frame list which is associated with a second buffer page that is referenced by the second page-action. The second frame's read weight state ("first read weight state"), which is associated with the second buffer page, is set to a "low" value, regardless of whether the first read weight state had a "high" or a "low" value. Further, the second frame's write weight state is not updated.

At block 440, if the cold-access queue is full, the buffer management module may select one or more page-actions from the tail of the cold-access queue, and remove these page-actions from the page-action list. Assuming a page-action ("third page-action") is selected from the tail of the cold-access queue, the buffer management module may locate the frame ("third frame") from the frame list which is associated with a third buffer page that is referenced by the third page-action. The third frame's write weight state ("first write weight state"), which is associated with the third buffer page, is set to a "low" value, regardless of whether the first write weight state had a "high" or "low" value. Afterward, the third frame should have a "low" read weight state and a "low" write weight state.

At block 450, a determination is made to check whether the operation's buffer action is a "read buffer action" or a "write buffer action." If it is a write buffer action, process 401 may proceed to block 451. If it is a read buffer action, then process 401 may proceed to block 453. At block 451, the buffer management module may set the first frame's write weight state ("second write weight state") to a "high" value. At block 453, the buffer management module may examine to see whether any page-action identical to the first page-action has been found in the hot-access queue. If the first buffer page is previously referenced in the hot-access queue, then the buffer management module may set the first frame's read weight state ("second read weight state"), which is associated with the first buffer page, to a "high" value. Otherwise, the first frame's second read weight state is not set to "high" value. In some embodiments, once the first buffer page is referenced in the page-action list, the first frame may be removed from an eviction candidate page index.

At block 460, the buffer management module may select a victim buffer page that is removed from the cold-access queue for eviction. The buffer management module may select a specific frame from the eviction candidate page index, and identify the victim buffer page that is associated with the specific frame. The specific frame associated with the victim buffer page may have its read weight state and write weight set to "low" values. At block 470, the victim buffer page may be evicted from the buffer.

Figure 5:
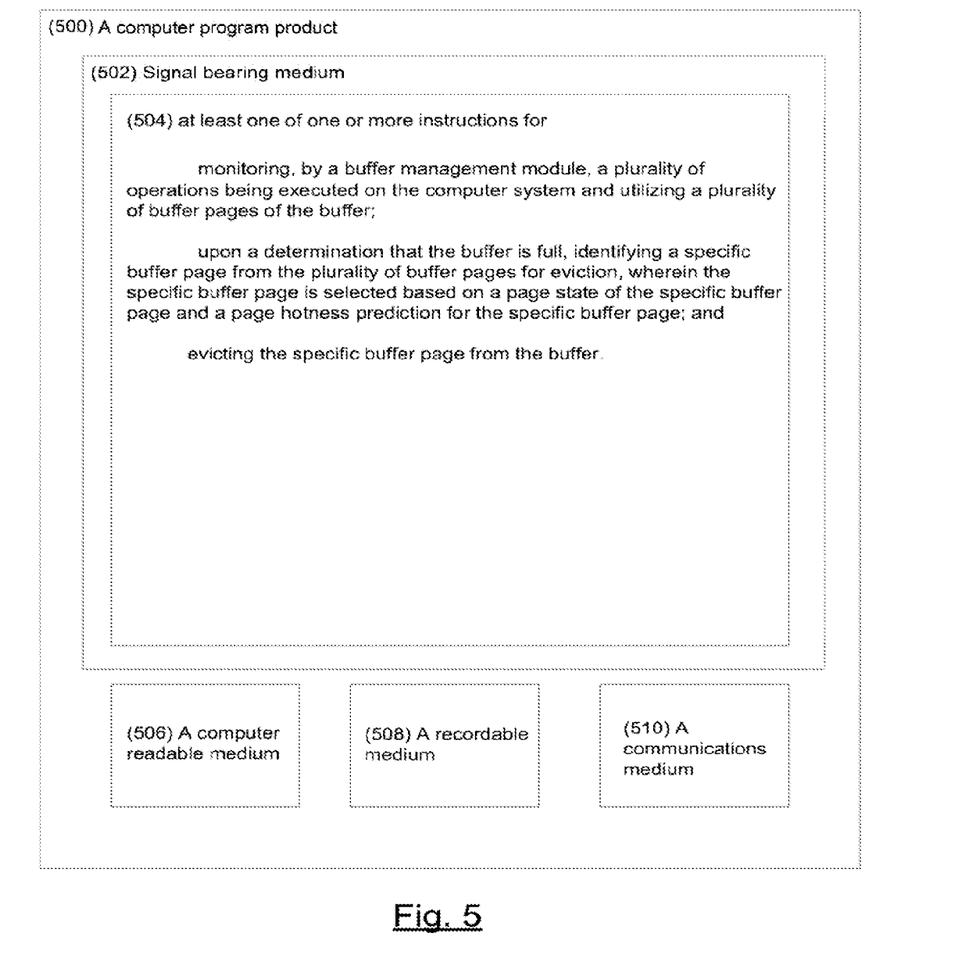
FIG. 5 shows an illustrative embodiment of an example computer program product.

FIG. 5 is a block diagram of an illustrative embodiment of a computer program product 500 for implementing a method for managing a buffer for a computer system. Computer program product 500 may include a signal bearing medium 502. Signal bearing medium 502 may include one or more sets of executable instructions 504 that, when executed by, for example, a processor, may provide the functionality described above. Thus, for example, referring to FIG. 1, the computer system 110, may undertake one or more of the operations shown in at least FIG. 3 and FIG. 4 in response to the instructions 504.

In some implementations, signal bearing medium 502 may encompass a non-transitory computer readable medium 506, such as, but not limited to, a hard disk drive, a Compact Disc (CD), a Digital Versatile Disk (DVD), a digital tape, memory, etc. In some implementations, signal bearing medium 502 may encompass a recordable medium 508, such as, but not limited to, memory, read/write (R/W) CDs, R/W DVDs, etc. In some implementations, signal bearing medium 502 may encompass a communications medium 510, such as, but not limited to, a digital and/or an analog communication medium (e.g., a fiber optic cable, a waveguide, a wired communications link, a wireless communication link, etc.). Thus, for example, referring to FIG. 1, computer program product 500 may be wirelessly conveyed to the computer system 110 by signal bearing medium 502, where signal bearing medium 502 is conveyed by communications medium 510 (e.g., a wireless communications medium conforming with the IEEE 802.11 standard). Computer program product 500 may be recorded on non-transitory computer readable medium 506 or another similar recordable medium 508.

Figure 6:
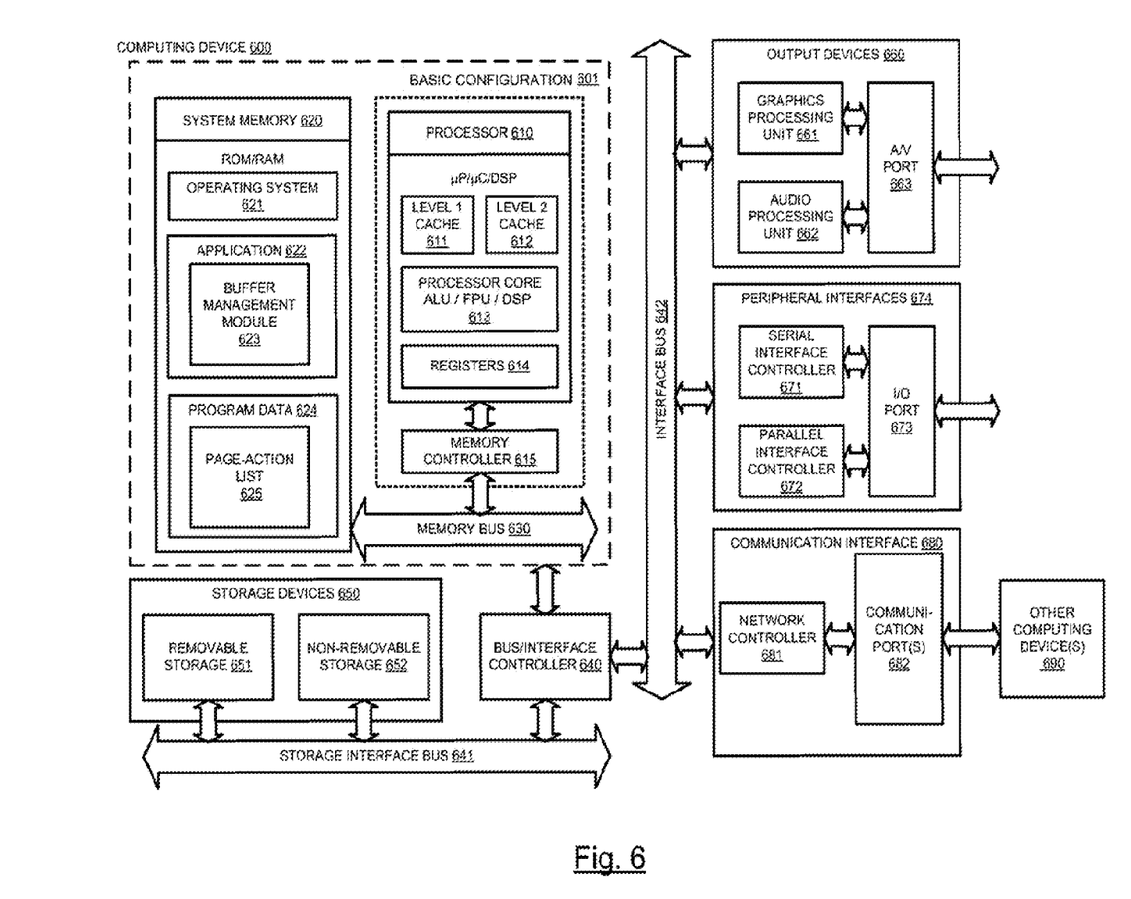
FIG. 6 shows a block diagram of an illustrative embodiment of an example computing system.

FIG. 6 shows a block diagram of an illustrative embodiment of an example computing device 600. In a very basic configuration 601, the computing device 600 may include one or more processors 610 and a system memory 620. A memory bus 630 may be used for communicating between the processor 610 and the system memory 620.

Depending on the desired configuration, processor 610 may be of any type including but not limited to a microprocessor (μP), a microcontroller (μC), a digital signal processor (DSP), or any combination thereof. Processor 610 can include one or more levels of caching, such as a level one cache 611 and a level two cache 612, a processor core 613, and registers 614. The processor core 613 can include an arithmetic logic unit (ALU), a floating point unit (FPU), a digital signal processing core (DSP Core), or any combination thereof. A memory controller 615 can also be used with the processor 610, or in some implementations the memory controller 615 can be an internal part of the processor 610.

Depending on the desired configuration, the system memory 620 may be of any type including but not limited to volatile memory (such as RAM), non-volatile memory (such as ROM, flash memory, etc.) or any combination thereof. The system memory 620 may include an operating system 621, one or more applications 622, and program data 624. The application 622 may include a buffer management module 623 that is arranged to perform the functions and/or operations as described herein including at least the functional blocks and/or operations described with respect to the process 301 of FIG. 3. The program data 624 may include page-action list 625 to be accessed by the buffer management module 623. In some example embodiments, the application 622 may be arranged to operate with the program data 624 on the operating system 621 such that implementations of the remote information retrieval may be provided as described herein. This described basic configuration is illustrated in FIG. 6 by those components within dashed line 601.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to", etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method to manage a buffer for a computer system, comprising:
maintaining a page-action list for monitoring a plurality of operations being executed on the computer system and utilizing a plurality of buffer pages of the buffer, wherein the page-action list contains a hot-access queue for recently accessed buffer pages and a cold-access queue for less accessed buffer pages;
upon a determination that the buffer is full, identifying a victim buffer page from the plurality of buffer pages for eviction, wherein the victim buffer page is selected from the cold-access queue and based on a page weight, which is calculated based on a page state of the specific buffer page and a page hotness prediction for the specific buffer page might be accessed by an incoming operation; and
evicting the victim buffer page from the buffer.

2. The method as recited in claim 1, further comprising during executing of a first operation which is selected from the plurality of operations and is accessing a first buffer page selected from the plurality of buffer pages, adding a first page-action referencing the first buffer page and storing the first operation's buffer action to the hot-access queue.

3. The method as recited in claim 2, further comprising upon determining that the first operation's buffer action is a write buffer action, setting a write weight state associated with the first buffer page to a high value.

4. The method as recited in claim 2, further comprising upon determining that the first operation's buffer action is a read buffer action and the first buffer page is referenced in the hot-access queue, setting a read weight state associated with the first buffer page to a high value.

5. The method as recited in claim 1, further comprising:
moving a second page-action, referencing a second buffer page selected from the plurality of buffer pages, from the hot-access queue to the cold-access queue; and
setting a read weight state associated with the second buffer page to a low value.

6. The method as recited in claim 5, further comprising:
removing a third page-action, referencing a third buffer page selected from the plurality of buffer pages, from the cold-access queue; and
setting a write weight state associated with the third buffer page to a low value.

7. The method as recited in claim 1, wherein the victim buffer page is associated with a low read weight state and a low write weight state.

8. A system configured to manage a buffer for a computer system, comprising:
a page-action list containing a hot-access queue for recently accessed buffer pages and a cold-access queue for less accessed buffer pages; and
a buffer management module coupled with the page-action list, wherein the buffer management module is configured to
monitor a plurality of operations being executed on the computer system and utilizing a plurality of buffer pages of the buffer,
upon a determination that the buffer is full, identify a victim buffer page from the plurality of buffer pages for eviction, wherein the victim buffer page is selected from the cold-access queue and based on a page weight, which is calculated based on a page state of the specific buffer page and a page hotness prediction for the specific buffer page might be accessed by an incoming operation; and
evict the victim buffer page from the buffer.

9. The system as recited in claim 8, wherein the buffer management module is further configured to
during executing of a first operation which is selected from the plurality of operations and is accessing a first buffer page selected from the plurality of buffer pages, add a first page-action referencing the first buffer page and storing the first operation's buffer action to the hot-access queue.

10. The system as recited in claim 9, wherein the buffer management module is further configured to
upon determining that the first operation's buffer action is a write buffer action, set a write weight state associated with the first buffer page to a high value.

11. The system as recited in claim 9, wherein the buffer management module is further configured to
upon determining that the first operation's buffer action is a read buffer action and the first buffer page is referenced in the hot-access queue, set a read weight state associated with the first buffer page to a high value.

12. The system as recited in claim 8, wherein the buffer management module is further configured to:
move a second page-action, referencing a second buffer page selected from the plurality of buffer pages, from the hot-access queue to the cold-access queue; and
set a read weight state associated with the second buffer page to a low value.

13. The system as recited in claim 12, wherein the buffer management module is further configured to:
remove a third page-action, referencing a third buffer page selected from the plurality of buffer pages, from the cold-access queue; and
set a write weight state associated with the third buffer page to a low value.

14. The system as recited in claim 8, wherein the victim buffer page is associated with a low read weight state and a low write weight state.

15. A non-transitory machine-readable medium having a set of instructions which,
in response to execution by a processor, cause the processor to perform a method to manage a buffer for a computer system, the method comprising:
maintaining a page-action list for monitoring a plurality of operations being executed on the computer system and utilizing a plurality of buffer pages of the buffer, wherein the page-action list contains a hot-access queue for recently accessed buffer pages and a cold-access queue for less accessed buffer pages;
upon a determination that the buffer is full, identifying a victim buffer page from the plurality of buffer pages for eviction, wherein the victim buffer page is selected from the cold-access queue and based on a page weight, which is calculated based on a page state of the specific buffer page and a page hotness prediction for the specific buffer page might be accessed by an incoming operation; and
evicting the victim buffer page from the buffer.

16. The non-transitory machine-readable medium as recited in claim 15, wherein the method further comprises
during executing of a first operation which is selected from the plurality of operations and is accessing a first buffer page selected from the plurality of buffer pages, adding a first page-action referencing the first buffer page and storing the first operation's buffer action to the hot-access queue.

17. The non-transitory machine-readable medium as recited in claim 16, wherein the method further comprises:
    upon determining that the first operation's buffer action is a write buffer action, setting a write weight state associated with the first buffer page to a high value; or
    upon determining that the first operation's buffer action is a read buffer action and the first buffer page is referenced in the hot-access queue, setting a read weight state associated with the first buffer page to a high value.

18. The non-transitory machine-readable medium as recited in claim 15, wherein the method further comprises:
    moving a second page-action, referencing a second buffer page selected from the plurality of buffer pages, from the hot-access queue to the cold-access queue; and
    setting a read weight state associated with the second buffer page to a low value.

19. The non-transitory machine-readable medium as recited in claim 18, wherein the method further comprises:
    removing a third page-action, referencing a third buffer page selected from the plurality of buffer pages, from the cold-access queue; and
    setting a write weight state associated with the third buffer page to a low value.

20. The non-transitory machine-readable medium as recited in claim 15, wherein the victim buffer page is associated with a low read weight state and a low write weight state.

* * * * *